US006332569B1

(12) United States Patent
Cordes et al.

(10) Patent No.: US 6,332,569 B1
(45) Date of Patent: Dec. 25, 2001

(54) ETCHED GLASS SOLDER BUMP TRANSFER FOR FLIP CHIP INTEGRATED CIRCUIT DEVICES

(75) Inventors: Steven A. Cordes, Cortlandt Manor; Peter Alfred Gruber, Mohegan Lake; Egon Max Kummer, Croton on Hudson; Stephen Roux, Purdys; Carlos Juan Sambucetti, Croton on Hudson; James Louis Speidell, Poughguag, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/578,319

(22) Filed: May 24, 2000

Related U.S. Application Data

(62) Division of application No. 09/019,396, filed on Feb. 5, 1998, now Pat. No. 6,105,852.

(51) Int. Cl.[7] .............................. B23K 31/02; B23K 35/02
(52) U.S. Cl. ................... 228/254; 228/180.22; 228/246; 228/248.1; 228/256
(58) Field of Search ................................ 228/248.1, 254, 228/246, 180.22, 245, 256; 257/737, 738; 438/613

(56) References Cited

U.S. PATENT DOCUMENTS

| | | | |
|---|---|---|---|
| 3,577,631 | 5/1971 | Bylander et al. | 29/572 |
| 4,412,642 | 11/1983 | Fisher, Jr. | 228/173 R |
| 4,473,621 | 9/1984 | Drylie | 428/576 |
| 4,839,497 | 6/1989 | Sankar et al. | 219/121.71 |
| 4,906,823 | 3/1990 | Kushima et al. | 228/245 |
| 4,914,814 | 4/1990 | Behun et al. | 29/843 |
| 5,216,807 | 6/1993 | Yoshizawa et al. | 29/876 |
| 5,219,117 | 6/1993 | Lin | 228/253 |
| 5,244,143 | 9/1993 | Ference et al. | 228/180.21 |
| 5,346,118 | 9/1994 | Degani et al. | 228/180 |
| 5,388,327 | 2/1995 | Trabucco | 29/830 |
| 5,607,099 | 3/1997 | Yeh et al. | 228/180.22 |
| 5,643,831 * | 7/1997 | Ochiai et al. | |
| 5,658,827 * | 8/1997 | Aulicino et al. | |
| 5,662,262 * | 9/1997 | McMahon et al. | |
| 5,695,109 * | 12/1997 | Chiang et al. | |
| 5,735,452 | 4/1998 | Yu et al. | 228/254 |
| 5,736,456 | 4/1998 | Akram | 436/614 |
| 5,770,884 | 6/1998 | Pogge et al. | 257/506 |
| 5,775,569 | 7/1998 | Berger et al. | 228/254 |
| 5,806,753 | 9/1998 | Bielick et al. | 228/248.1 |
| 5,829,668 * | 11/1998 | George et al. | |
| 5,872,051 * | 2/1999 | Fallon et al. | |
| 5,877,079 | 3/1999 | Karasawa et al. | 438/613 |
| 5,909,634 * | 6/1999 | Hotchkiss et al. | |
| 5,950,908 * | 9/1999 | Fujino et al. | |
| 6,025,258 * | 2/2000 | Ochiai et al. | |
| 6,090,301 * | 7/2000 | Mizukoshi et al. | |

OTHER PUBLICATIONS

Herdzik et al. "Tinning Preplated Sites on a Substrate" IBM Technical Disclosure Bullletin, vol. 19, No. 8 Jan. 1977 p. 3049–3050.

"Brazing and Soldering Alloys", Brochure, Semi–Alloys Inc. MacQues–Ten Parkway, Mount Vernon, N.Y. 5 pages (no date available).

* cited by examiner

Primary Examiner—Tom Dunn
Assistant Examiner—Kiley Stoner
(74) Attorney, Agent, or Firm—David P. Morris; Alvin J. Riddles

(57) ABSTRACT

A precise volume, precisely registerable carrier is provided for use with injection molding for producing integrated circuit bump contacts in the "flip chip" technology. A hemispherical cavity is produced by etching through and undercutting a registered opening into a transparent carrier. The hemispherical cavity has related specific volume and visible peripheral shape that permits simple optical quality control when the injection molding operation has filled the cavity and simple optical registration for fusing to the pads on the integrated circuit.

12 Claims, 2 Drawing Sheets

ETCHED GLASS SOLDER BUMP TRANSFER FOR FLIP CHIP INTEGRATED CIRCUIT DEVICES

This application is a divisional of 09/019,396 filed Feb. 5, 1998, now U.S. Pat. No. 6,105,852.

The invention relates to the providing of precise solder bumps on an integrated circuit element for simultaneous fusing in attachment to circuitry.

BACKGROUND OF THE INVENTION AND RELATION TO THE PRIOR ART

The interconnection technology of semiconductor integrated circuits to circuit bearing substrates has evolved into the use of a technique known as "flip chip" where the interconnection elements are contact bumps that are fused in a first temperature cycle to the precise locations or pads on the integrated circuit element or chip that correspond to specific locations in the corresponding circuit bearing substrate so that the contact bumps support the inverted integrated circuit in position on the substrate during a second temperature cycle where there is simultaneous fusion of all contact bumps to the corresponding circuit locations.

As the "flip chip" art has progressed, the technology has expanded from the considerations involved for individual chips in the direction of the precision necessary for interconnection of complete water areas to broad area circuitry. As the expansion takes place, the number of connections increases, the spacing becomes closer and any differences in interconnection height must be controlled.

Tighter constraints have further become necessary on the volume and type of metal usable in the bump, the response of that metal in the temperature cycles and the ability to perform alignment of the bump contacts to the pads on the chip in the manufacturing operation.

One technique used in the art has been to provide a carrier member for the bump metal increments wherein there is a cavity at each location of a contact bump. The cavity is filled with a metal that under a fusing temperature the surface tension of the liquid metal forms a ball shaped bump. The ball shaped bump in the carrier cavity is then brought into contact with and fused with a corresponding contact pad on the chip. The resulting structure is a ball shaped bump contact on the chip. The technology is described in U.S. Pat. No. 5,607,099.

Another technique in the art involves the use of injection molding of a liquid solder metal into measured volume, precisely located, cavities in a mold plate. The mold plate is then positioned in registration on the pad contact surface of the chip with the metal in each filled cavity in contact with the desired pad location so that a heat cycle fuses the contents of it's respective cavity to the corresponding pad on the chip. The technique is described in copending patent application Ser. No. 08/741,453 filed Oct. 31, 1996, assigned to IBM.

SUMMARY OF THE INVENTION

The invention provides a precise volume, precisely registerable contact bump carrier for use with injection molding in providing bump contacts that are all the same size, the same height and respond identically to heat cycles in the "flip chip" integrated circuit technology.

In the invention, a precise volume, hemispherical cavity, is produced by etching through and undercutting around a registered opening into a transparent carrier. The hemispherical cavity has related specific volume and visible peripheral shape that permits simple optical quality control when the injection molding operation has filled the cavity and simple optical registration for alignment to the pads on the integrated circuit.

BRIEF DESCRIPTION OF THE DRAWINGS

FIGS. 5–7 illustrate the formation of the hemispherical cavity in the transparent carrier by etching: wherein FIG. 5 illustrates the patterning and etch resistant layers;

FIG. 6 illustrates the wear resistant layer and the etch and fill opening on the carrier; and, FIG. 7 illustrates the formation of the etched undercut controlled volume cavity.

DESCRIPTION OF THE INVENTION

The invention provides a method and related structural elements that address a number of problems in the technology of "flip chip" bonding of interconnections to integrated circuitry.

Figure 1:
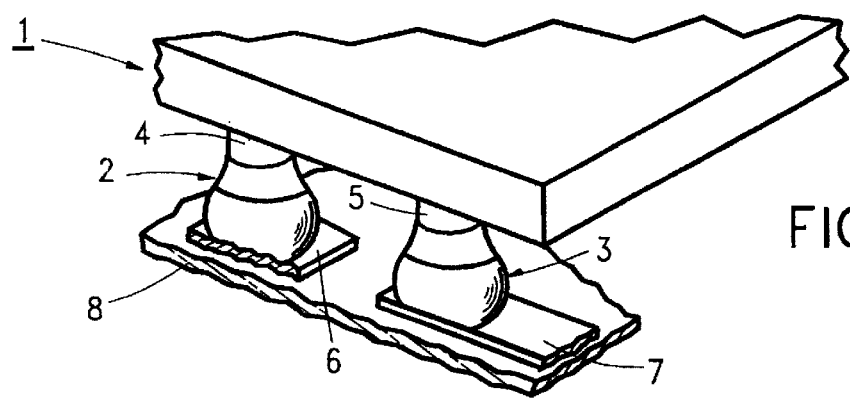
FIG. 1 is a perspective view of a portion of a "flip chip" integrated circuit illustrating critical dimensional considerations in the practice of the "flip chip" packaging technology.

Referring to FIG. 1 there is shown a perspective view of a portion of a "flip chip" integrated circuit element exhibiting the location and type of the dimensional considerations involved in the practice of the technology.

In FIG. 1 a semiconductor integrated circuit element 1 is equipped with one or a plurality, of which two are shown, of bump contacting members 2 and 3 which provide electrical connections between circuitry output pads 4 and 5 on the underside of the element 1 and circuitry conductors 6 and 7 on a circuitry supporting substrate B.

In the technology heat cycles are used together with relatively low temperature liquifying metals so that localized fusion can take place. The metals may be of various elements, metallurgical compositions and physical forms. For purposes of this explanation the term solder is used for any relatively low temperature melting metal used for the bump contacts.

In the "flip chip" technology a heat cycle of a measured heat excursion and dwell at the higher temperature of the excursion is applied that operates to simultaneously fuse the solder of each and every one of the contacts represented by 2 and 3 to the respective conductors represented by 6 and 7 on the substrate 8. It is essential for efficient use of the available space that there be as many contacting members as possible, and they be positioned as proximate as possible. It is also essential that the volume of the contact metal be uniform, sufficient for strength, but not out of proportion to what can be retained by surface tension when the solder liquifies during the heat cycle. It is also essential that the height of the bump contacting members 2 and 3 between underside of the integrated circuit element 1 and the conductor 6 and 7 surface of the substrate 8 be sufficiently uniform for essentially equal thermal transfer during the heat cycle so as to form equally fused bonds at all the bump contacting members.

The invention provides a method and related structural features that permits injected molded solder contacts of the type shown in FIG. 1 to meet the considerations discussed in connection with FIG. 1. With the method and structural features of the invention each bump contact such as 2 and 3 is provided with the same volume of solder, each is equally bonded to the respective pad such as 4 and 5 and each is the same height from the pads 4 and 5 to the surface of the circuitry member 8.

Figure 2:
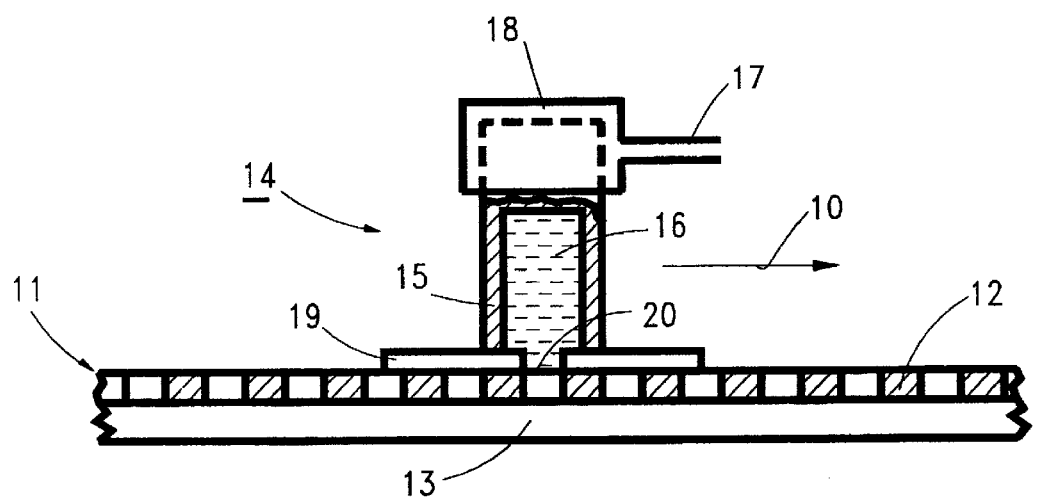
FIG. 2 is a cross sectional view of an illustrative solder injection molding apparatus.

Referring to FIG. 2 there is shown a schematic cross section of a liquid solder injection molding type apparatus available in the art. The apparatus of FIG. 2 scans along the direction of the double headed arrow 10 over a mold plate 11 containing solder receiving cavities 12 that are spaced to correspond with the contact pad locations of the integrated circuit. The mold plate 11 is supported by a base plate 13. The injection molding type apparatus has a head member 14 that has a housing 15 with a reservoir of liquid solder 16 that is kept at liquifying temperature and under uniform inert (such as nitrogen) gas pressure 17 applied through a manifold 18. The housing has a faceplate 19 with a precise opening 20 which is a narrow slot allowing solder flow and the size of which covers the cavity array, and the length of several cavities.

The scanning operation registers the opening 20 over one of the cavities 12 at each step and the gas pressure operates to inject the liquid solder 16 into the registered cavity.

In accordance with the invention advantages in solder volume precision, intermediate inspection ability and alignability are achieved by providing an improved carrier that can be substituted for the mold plate 11 of the injection molding type apparatus of FIG. 2.

The carrier of the invent ion is made of a coefficient of expansion matched with the integrated circuit material, usually silicon, non solder wetting, chemical etchant responsive, essentially transparent material, such as glass.

The cavities in the carrier are hemispherically shaped, and are produced by a single undercut chemical etching manufacturing operation. The cavity shape and the material of the carrier permits the single chemical etching operation through a registered opening or hole in chemical etchant resistant cover layers that are removable, to produce a precise volume solder bump contact, with any imperfections that may occur in an injected cavity filling operation through the same hole to be located at the large diameter periphery of the solder filling with the surface of the carrier, which is the most visible location.

Figure 3:
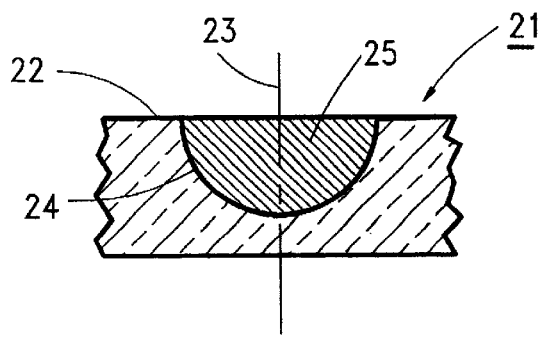
FIG. 3 is a cross sectional schematic view of the transparent carrier of the invention illustrating the hemispherical cavity.

Referring to FIG. 3 wherein there is shown a cross sectional schematic view of the transparent carrier with hemispherical cavities of the invention. In FIG. 3 the carrier 21 is of a material such as glass that is relatively flat and transparent and is expansion matched with the material of the integrated circuit to which the bump contacts are to be bonded in a heat cycle. The material of the carrier 21 is further responsive to a uniform chemical etching operation which when applied to the surface 22 through a chemical etch resistant capability, not shown in FIG. 3, in an area along line 23, there is formed the precise volume hemispherical cavity 24.

Figure 5:
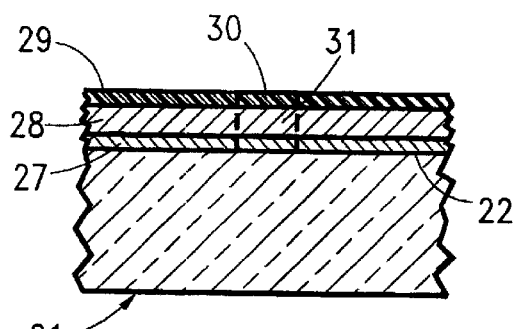
Figure 6:
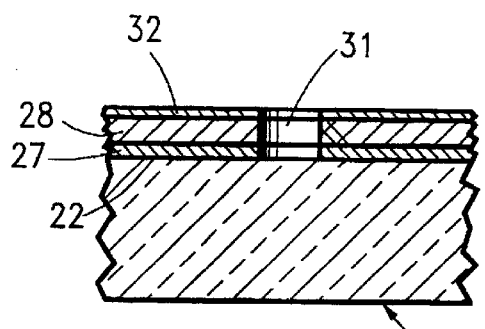
Figure 7:
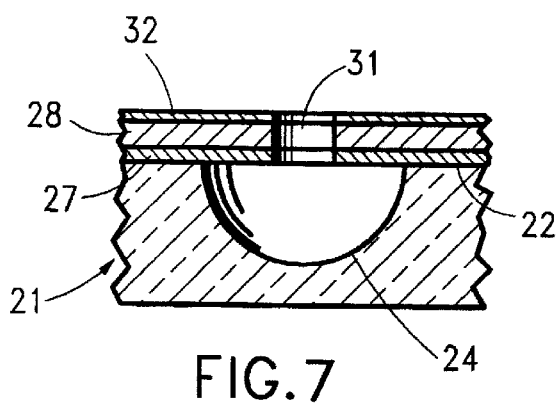

The chemical etching operation to be described in greater detail in connection with FIGS. 5–7, is performed through an opening in a removable chemical etch resistant capability layer on the carrier. The location of the opening corresponds to an integrated circuit pad location centered around line 23 and provides a hole exposing surface 22 of the carrier 21.

The chemical etch operation on the exposed portion of the surface 22 in the hole emanates in all directions undercutting the chemical etch resistant capability and forming the hemispherical cavity 24.

In FIG. 3, solder 25 in liquid form has been injected into and fills each cavity 24 through the opening that exposed the portion of the surface 22 of the carrier 21.

The chemical etch resistant capability is removed before the filling of the cavity 24. Once the chemical etch resistant layers are removed, the carrier 21 is thoroughly cleaned and is ready for the injection molding filling operation shown in FIG. 2.

With the invention, a visual inspection can be accurately performed after the filling of the cavities by injection molding. The carrier 21 being transparent together with the hemispherical shape of the cavities makes imperfections resulting from not fully filling the cavities occur at the edges of the largest diameter at the surface 22 where they are most apparent.

Figure 4A:
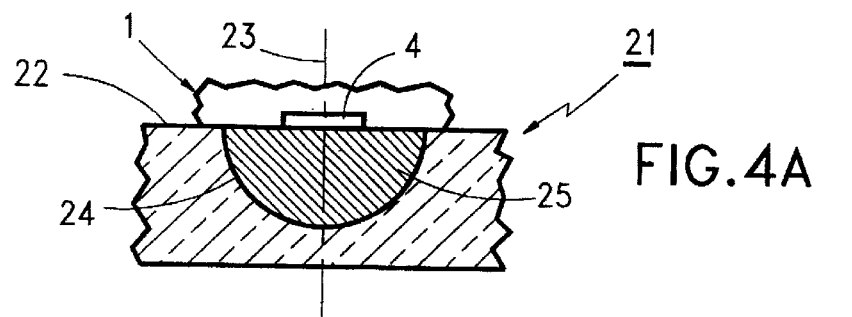
FIG. 4A is a cross sectional illustration of the carrier and the pad alignment.

In FIG. 4A there is shown a cross sectional illustration of the alignment and the results of the heat cycle that fuses the contents of the cavity to the pad on the integrated circuit. Referring to FIG. 4A, a representative pad 4 on the integrated circuit I is aligned and is in contact with the solder 25. This is essentially accomplished by visually centering the pad 4 with respect to the diameter of the solder 25 where the cavity 24 meets the surface 22.

Figure 4B:
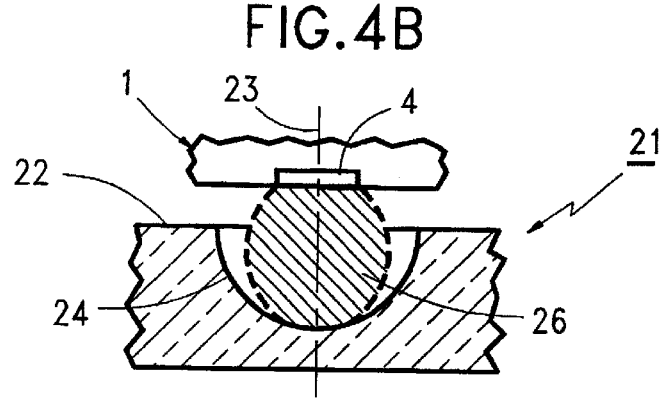
FIG. 4B is a cross sectional illustration of the carrier and the pad alignment and the results of a fusion heat cycle.

Continuing with FIG. 4B, a heat cycle is applied that fuses the solder 25 to the pad 4 and by surface tension the solder 25 forms a ball 26. During this transfer fusing, the surface tension also causes the spherical ball 26 to have a greater height than the solder filled hemisphere 25. All bump contacts have highly uniform solder volumes and all contacts have the same height dimension from the pad 4 to the portion of the solder 25 at the deepest portion of the cavity 24.

In FIGS. 5–7 there is illustrated the considerations in the etching formation and solder injection filling of the hemispherical cavity in the transparent carrier 21.

Referring to FIG. 5 the carrier 21 is of a borosilicate glass such as is sold under the trademark Borofloat by the Schott Corporation. The surface 22 of the carrier 21 is cleaned in preparation for metallization using one or more standards in the art such as Huang cleaning solutions involving 5 parts water to 1 part hydrogen peroxide or 1 part ammonium hydroxide. The cleaning is followed by an etch of the surface 22 in dilute hydrofluoric acid to remove 2000 to 5000 Angstroms (Å) of the glass surface. This also tends to remove some superficially damaged layers.

An adhesion metallization layer 27 such as sputtered chromium about 300 Å thick is applied on the cleaned and etched surface 22. An etch resistant layer 28 such as sputtered 27. An essential feature in the deposition of metallization and etch resistant layers, is to keep the intrinsic stress of the layers as neutral as possible. To control the intrinsic stress, one way is to preheat the carrier 21 during sputtering to produce neutral stressed or slightly compressed layers. This can also be achieved by adjusting the deposition parameters of the layers.

A photoresist layer 29 is applied on the layer 28. The layer 29 is patterned for the correlation to the corresponding pad on the integrated circuit so as to expose the layer 28 at location 30 using standard lithographic techniques. Separate etches are used for the copper and the chromium layers in forming the opening 31 down to the surface 22. The remainder of the photoresist layer 29 is then removed using photoresist removal techniques.

Referring to FIG. 6, in order to give strength to the metallized layers 27 and 28 and to seal any pinhole defects, a plated layer 32 of for example 3 micrometers of gold or copper is applied over the layer 28. The layers 27, 29 and 32 provide a chemical etchant resistant coating.

The structure of FIG. 6 is then placed chemical etching solution for the material of the carrier where the solution produces the cavity 24 in the surface 22 through the opening 31. A satisfactory isotropic glass etching solution is 10% to 20% hydrofluoric acid in water at 50 C.

Referring to FIG. 7 there is illustrated the formation of the etched undercut, controlled volume, cavity followed by the injection filling of the cavity with the solder for the bump contact.

In FIG. 7, the etching of the glass proceeds in all directions through the exposed surface 22 in the opening 31. A hemispherical cavity 24 is formed with a significant undercut under the layer 27 all around the opening 31. The etch endpoint can be determined optically by measurement of the cavity diameter which is visible through the glass of the carrier 21. Following the glass etching operation of the carrier 21, and when all cavities in the carrier 21 have been properly formed by the etching processes, wet chemical etchants are then used to strip the layers 27, 28 and 32 leaving all the cavities 24 ready for use as shown in FIG. 2.

In the invention a precise opening, typically 25 micrometers in diameter is provided through a photoresist layer, a copper layer and a chromium adhesion layer on an about a 3 millimeter thick borosilicate glass carrier. The hemispherical cavity is formed in the glass carrier by etching through the precise opening with a 10% HF in H O etch providing an about a 120 micrometer undercut diameter and a 60 micrometer maximum depth. The photoresist, copper and chromium layers are removed by etching and the hemispherical cavity is filled by injection molding with a 63Pb37Sn solder for example that liquifies in a 200 degree C. temperature cycle into a ball that is later transferred onto a circuit pad. The spacing between cavities is of the order of 150 micrometers.

What has been described is the formation of precise bump contacts for "flip chip" packaging using a hemispherical cavity in a transparent carrier in injection molding.

What is claimed is:

1. The method of providing bump contacts for a flip chip integrated circuit having contact pads on a surface,
    comprising the steps of:
    forming, in an approximately flat, chemical etchant responsive, transparent, glass carrier member, a distribution of contact volume quantities of solder in cavities each exposed at a surface of said carrier,
        said distribution corresponding to a distribution of said contact pads on said integrated circuit,
        said forming step of said distribution being achieved by the steps of,
            providing a hole in a glass etchant resistant coating on said glass carrier member at the location of each member of said distribution,
            etching through said hole a hemispherical cavity that undercuts said coating around said hole,
    aligning said distribution of pads with said distribution of exposed contact volume quantities by optically centering said pads over said contact volumes as viewed employing said carrier transparency, and,
    applying a heat cycle sufficient to fuse said distributions of pads and contact volume quantities.

2. The method of claim 1 wherein said glass of said carrier member is of the borosilicate type.

3. The method of claim 1, in the providing of the hole in said glass etchant resistant coating on said glass carrier member,
    the additional steps comprising:
        applying an adhesion metallization layer on said surface of said carrier,
        applying a metal etch resistant layer over said adhesion layer, and,
        applying a patterned photoresist layer over said etch resistant layer,
            said patterning exposing an area for etching, corresponding to said distribution of pads.

4. The method of claim 3 wherein: said adhesion metallization layer is sputtered chromium.

5. The method of claim 4 wherein: said adhesion metallization layer is sputtered chromium, and, said metal etch resistant layer is copper.

6. The method of claim 4 wherein:
    said adhesion metallization layer is sputtered chromium,
    said metal etch resistant layer is copper, and,
    said adhesion metallization layer and said metal etch resistant layer are applied under conditions for neutralization of stress.

7. The method of claim 6 wherein said neutralization of stress is achieved through preheating said carrier member.

8. The method of claim 7 including the step of etching a hole through patterned openings down to and exposing said carrier using copper and chromium layer etches.

9. The method of claim 8 including the additional step of the removal of said photoresist layer exposing said copper layer.

10. The method of claim 9 including the strengthening and pinhole sealing step of applying a chemical etch resistant coating over said copper layer.

11. The method of claim 10 wherein said chemical etch resistant coating is three micrometers of a metal taken from the group of gold and copper.

12. The method of claim 11 including etching said carrier through said hole with a solution of 10% to 20% hydrofloric acid in water at 50 degrees C.

* * * * *